(12) United States Patent
Petersson

(10) Patent No.: US 8,880,538 B1
(45) Date of Patent: Nov. 4, 2014

(54) ELECTRONIC DOCUMENT ENCODING

(75) Inventor: Daniel Petersson, Vasteras (SE)

(73) Assignee: Google Inc., Mountain View, CA (US)

( * ) Notice: Subject to any disclaimer, the term of this patent is extended or adjusted under 35 U.S.C. 154(b) by 360 days.

(21) Appl. No.: 13/369,028

(22) Filed: Feb. 8, 2012

Related U.S. Application Data

(60) Provisional application No. 61/440,854, filed on Feb. 8, 2011.

(51) Int. Cl.
*G06F 17/30* (2006.01)

(52) U.S. Cl.
USPC .......................................................... 707/756

(58) Field of Classification Search
CPC ................................................ G06F 17/30132
USPC ............... 707/5, 200, 756; 717/143; 370/477; 709/204–206
See application file for complete search history.

(56) References Cited

U.S. PATENT DOCUMENTS

| | | | |
|---|---|---|---|
| 7,668,386 B2 | 2/2010 | Beatty | |
| 7,696,906 B2 | 4/2010 | Dey | |
| 8,000,541 B2 | 8/2011 | Gosian | |
| 2004/0267822 A1* | 12/2004 | Curran et al. | 707/200 |
| 2006/0005175 A1* | 1/2006 | Ringseth et al. | 717/143 |
| 2009/0089275 A1* | 4/2009 | Drory et al. | 707/5 |
| 2010/0254410 A1* | 10/2010 | Collins | 370/477 |
| 2011/0161372 A1 | 6/2011 | Jones | |

OTHER PUBLICATIONS

'David MacKay' [online]. "Compression Algorithms," 2008, [retrieved on Feb. 8, 2012]. Retrieved from the Internet: URL:< http://www.inference.phy.cam.ac.uk/itprnn/code/c/compress/.> 4 pages.
'W3C' [online]. "Efficient XML Interchange (EXI) Primer—W3C Working Draft Dec. 8, 2009," 2009, [retrieved on Feb. 8, 2012]. Retrieved from the Internet: http://www.w3.org/TR/2009/WD-exi-primer-20091208/.> 28 pages.
'WAPForum' [online]. "Binary XML Content Format Specification," 2001, [retrieved on Feb. 8, 2012]. Retrieved from the Internet: URL: http://www.openmobilealliance.org/tech/affiliates/wap/wap-192-wbxml-20010725-a.pdf>. 30 pages.
'Wikipedia' [online]. "Binary XML," 2012, [retrieved on Feb. 8, 2012]. Retrieved from the Internet: URL: < http://en.wikipedia.org/wiki/Binary_XML.> 2 pages.

* cited by examiner

*Primary Examiner* — Etienne Leroux
(74) *Attorney, Agent, or Firm* — McDonnell Boehnen Hulbert & Berghoff LLP

(57) ABSTRACT

In general, the subject matter described in this disclosure can be embodied in methods, systems and program products. An input document is received. A computing system determines whether a first portion of text is listed in a table of textual content. A computing system inserts into an output document, as a result of determining that the first portion of text is not listed in the table of textual content, the first portion of text. A computing system adds the first portion of text into the table of textual content. A computing system determines whether a second portion of text is listed in the table of textual content, wherein the second portion of text matches the first portion of text. A computing system inserts a reference to the first portion of text from the table of textual content into the output document. A computing system stores the output document.

20 Claims, 15 Drawing Sheets

*302* [stream header ] [node = "OrgA:message"] [attribute count] [child count] [QName  continued on FIG. 3B →
*304* *306* *312* *314* *316* *318*
[@][dictionary version] [header ] [header ] [QName Ref]
*310* *328* *330*

[xxxxSSTT] [WWxxSSTT]

← cont. FIG. 3A     node = "OrgA:messsage"     cont. FIG. 3C →
                          310
                          320

[attribute 1 = "to=dan@example.com"]
                 332                                    334

[Qname          ] [Text                              ]
       336           338      340     342         344

[header  ] [QName Ref] [header    ] [size] [data]

[WWxxSSTT]        [xxxRSSTT]

308 { "01000001" "3"   "00000010" "15"  "dan@example.com"

FIG. 3B

← cont. FIG. 3B    node = "OrgA:message"    cont. FIG. 3D →
                         322
                                                310

[attribute 2 = "from=mary@example.com"]
                   346
                                        348
[QName    ] [Text                              ]
  350    352       354
[header   ] [QName Ref] [header   ] [size] [data]
                                356          358

[WWxxSSTT]              [xxxRSSTT]

308 { "01000101"  "792"   "00000010"  "16"  "mary@example.com"

FIG. 3C

← cont. FIG. 3C    node = "OrgA:message"    cont. FIG. 3E →

310
                              360

[child 1 ="OrgB:subject" Node                                      ]
       362
[header  ] [attribute count] [child count] [QName  ] [qName Ref] [header  ] [child 1 = text  ]
                                                       362                         364

[header     ] [qName Ref] [header     ] [size] [data ]

[xxxxSSTT]                                  [WWxxSSTT]                 [xxxRSSTT  ]

308 { "00000000"  "0"    "1"    "0100001"   "6"           "00000010"   "5"    "Hello"

← cont. FIG. 3D    node = "OrgA:message"    cont. FIG. 3F →

366

[child 2 ="OrgA:body"    cont. FIG. 3F →

[header  ] [attribute count] [child count][qName  ] [qName Ref]

[header  ]    [WWxxSSTT  ]

[xxxxSSTT]

← cont. FIG. 3E    node = "OrgA:message"    cont. FIG. 3G →
                              366
← cont. FIG. 3E    child 2 ="OrgA:body"    cont. FIG. 3G →
                              368

[attribute 1 = OrgA:fontColor='blue'
                  369                                    ]
                                                         373
[qName                                    ][Text         ]
              370                              372

[header    ][Ns-Ref] [Text    ][header    ][size] [data ][header    ] [size] [data ]

[WWxxSSTT]              [xxRSSTT]              [xxRSSTT]

308 { "10000001"  "0"   "00000010" "9"  "font color"  "00000010" "4"  "blue"

FIG. 3F

← cont. FIG. 3F   node = "OrgA:message"   cont. FIG. 3H →
                              366

← cont. FIG. 3F   child 2 ="OrgA:body"   cont. FIG. 3G →
                              374

[child 1 =text "Hey! Email Me."                    ]

[header    ] [size] [data                          ]

[xxRSSTT ]

308 { "00000010" "14" "Hey Email Me."

← cont. FIG. 3E    node = "OrgA:message"    cont. FIG. 3G →
                      *366*

← cont. FIG. 3E    child 2 ="OrgA:body"    cont. FIG. 3G →
                      *376*

[child 2 = node "OrgC:<BR/>" ]
                           *378*

[header   ] [attribute count] [child count] [qName    ] [text = Namespace "OrgC"] [ text =local part "BR" ]
                                              *380*                            *382*

[header   ] [size] [data  ] [header   ] [size] [data]

[WWxxSSTT] [xxRSSTT]    "00000001"   "00000010" "4"   "OrgC"   "00000010" "2"   "BR"

[xxxxsstt  ]

310
← cont. FIG. 3H   node = "OrgA:message" ]

← cont. FIG. 3H   child 2 ="OrgA:body"   ]
                        384

[child 3 = text "dan@example.com   ]

[header    ] [text-ref    ]

[xxxRSSTT]

ELECTRONIC DOCUMENT ENCODING

CROSS-REFERENCE TO RELATED APPLICATION

This application claims priority to U.S. Provisional Application Ser. No. 61/440,854, filed on Feb. 8, 2011, entitled "Binary XML Encoding," the entire contents of which are hereby incorporated by reference.

BACKGROUND

An electronic document may include data that is tagged with one or more elements that identify the type and meaning of the data. The Extensible Mark-up Language (XML) format is one example protocol that specifies a tag markup construct to identify the meaning of data contained within a document. The size of an XML document is generally proportional to the number of instances of tags and associated data in the document. In this manner, a document having a large number of tags and associated data may require more resources for storing and transmitting the document over a network in comparison with a document that has a smaller number of tags and data.

SUMMARY

As described below, a document that includes tagged data (e.g., an XML file) may be encoded to reduce a size of the document. The encoding process can include inserting, in place of tags in the document, references to the tags, the references obtained from a predefined table of tags. The encoding process may include storing, in a table that can be dynamically-generated as the document is encoded, references to text in the document so that subsequent occurrences of the text may be identified with references to the text in the table, instead of with the actual text. The encoding process may use variable length fields for numbers. The encoding process can operate without specifying end tags.

In general, one aspect of the subject matter described in this disclosure can be embodied in a computer-implemented method for encoding a document. The method includes receiving an input document that includes data elements that identify semantics of respective data values in the input document. The method includes identifying a first data element in the input document. The method includes determining, by a computing system, whether a name of the first data element is listed in a table of data element names. The method includes inserting, by a computing system, into an output document, as a result of determining that the name of the first data element is listed in the table of data element names, a reference to the name of the first data element from the table of data element names. The method includes identifying a first data value in the input document, the first data value corresponding to the first data element. The method includes determining, by a computing system, whether the first data value is listed in a table of textual content. The method includes inserting, by a computing system, into the output document, as a result of determining that the first data value is not listed in the table of textual content, the first data value. The method includes adding, by a computing system and as a result of determining that the first data value is not listed in the table of textual content, the first data value into the table of textual content. The method includes identifying a second data element in the input document. The method includes determining, by a computing system, whether a name of the second data element is listed in the table of data element names. The method includes inserting, by a computing system, into the output document, as a result of determining that the name of the second data element is not listed in the table of data element names, the name of the second data element. The method includes identifying a second data value in the input document, the second data value corresponding to the second data element. The method includes determining, by a computing system, whether the second data value is listed in the table of textual content, wherein content of the second data value matches content of the first data value. The method includes inserting, by a computing system, into the output document, as a result of determining that the second data value is listed in the table of textual content, a reference to the first data value from the table of textual content. The method includes storing, by a computing system, the output document, the stored output document including (i) the reference to the name of the first data element from the table of data element names, (ii) the first data value, (iii) the name of the second data element, and (iv) the reference to the first data value from the table of textual content.

Particular implementations can, in certain instances, realize one or more of the following advantages. The size of an electronic document may be reduced. The reduction in size may conserve computer processing and storage resources, causing a reduction in power consumption and freeing such resources for use by other computer processes. The amount of data transmitted over a network may also be reduced, enabling data to be transmitted more quickly and with less expense.

The details of one or more implementations are set forth in the accompanying drawings and the description below. Other features, objects, and advantages will be apparent from the description and drawings, and from the claims.

BRIEF DESCRIPTION OF DRAWINGS

FIGS. 3A-3I show a process for converting a document into a binary compressed output.

Like reference symbols in the various drawings indicate like elements.

DETAILED DESCRIPTION

An encoding process may receive a document or data stream that includes tagged data as an input and may generate an encoded document or data stream as an output. The output document or data stream may be compressed such that a stored size of the output document may be smaller than a stored size of the input document. A decoding system may be able to losslessly regenerate the content of the input document in its entirety from the output document. A networked computing system may be able to process encoded documents more efficiently and more rapidly than non-encoded documents. Further, encoded documents may use less computer memory than non-encoded documents.

Figure 1:
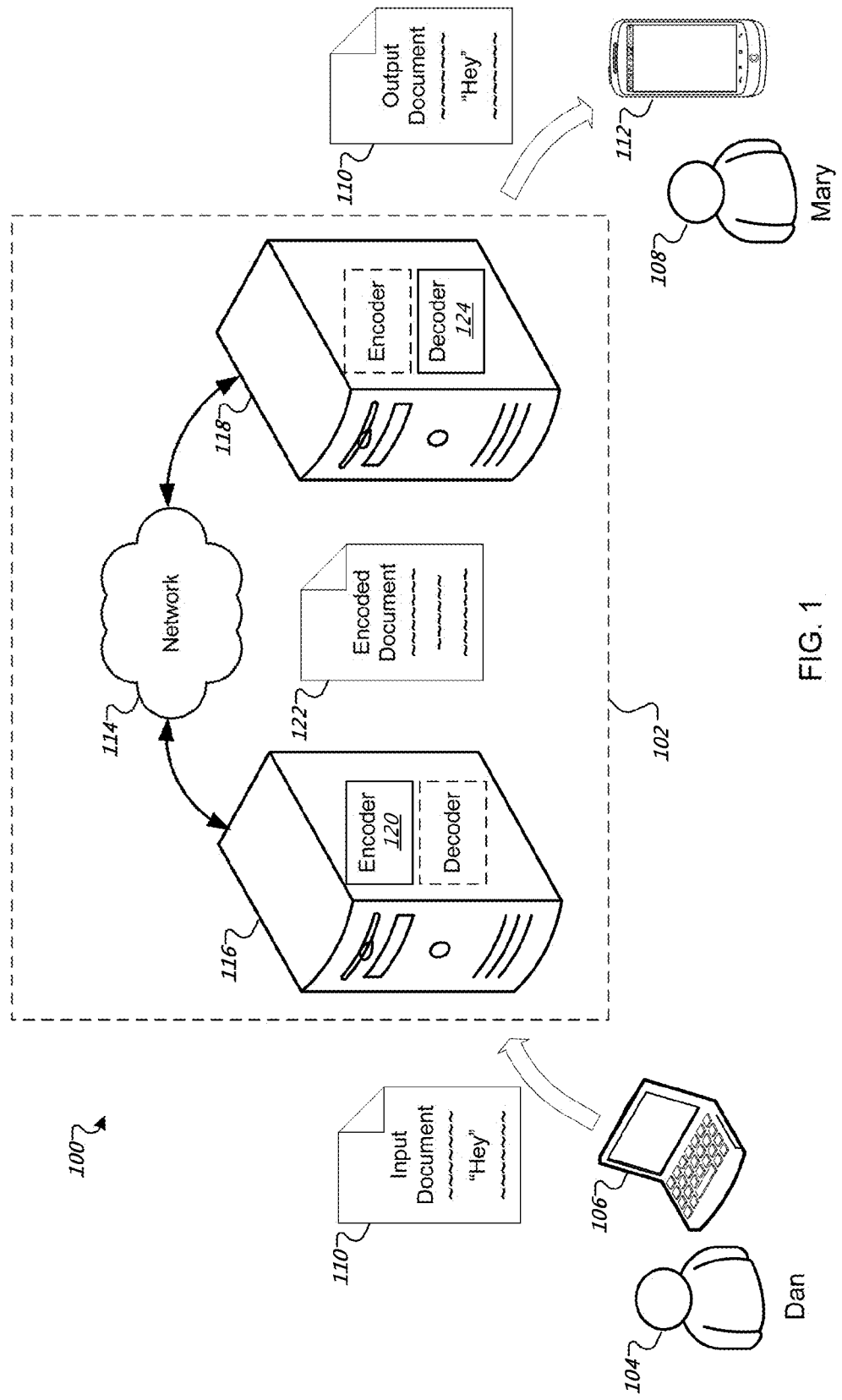
FIG. 1 shows a diagram that illustrates two users communicating using a computer-networked chat system.

FIG. 1 shows a diagram 100 that illustrates two users communicating using a computer-networked chat system 102. As an illustration, Dan 104 is using his computer 106 and is browsing the Internet when he notices that his Internet chat client indicates that Mary 108 is available for a chat session. Dan may open a chat window for composing a message to Mary, and may type a message that includes a subject "Hello" and a body "Hey! Email me. dan@example.com." Dan may select a "send" button and, as a result, his computer may process the text that Dan entered into the subject and body fields in order to generate a document 110 for transmission over one or more networks (e.g., the Internet) to Mary's computer 112.

In some examples, the chat system 102 is based on the Extensible Messaging and Presence Protocol (XMPP). In general, XMPP is an open-standard communications protocol for messaging systems that is based on Extensible Markup Language (XML). With XMPP systems, communications between users are accomplished by the transmission and receipt of XMPP stanzas. A single message that is transmitted from one computer to another can include one or more stanzas, which are defined portions of the message that serve particular defined roles in the message. As an example with reference to FIG. 1, Dan's computer 106 transmits the document 110 to Mary's computer 112 via the chat system 102. The document 110 includes one or more stanzas that include commands, requests, and/or content of messages composed by Dan.

The XMPP protocol specifies three primary stanzas: a <presence> stanza, a <message> stanza, and an <iq> (info/query) stanza. Each stanza can include at least one XML element and the children to the XML element. A <presence> stanza can control and report an availability of a user for communicating. Such availability may include an "online" availability, "offline" availability, and "do not disturb" availability, among others. A <message> stanza can be used to send a message from one user to one or more other users. An <iq> stanza can provide a request and response mechanism for XMPP communication such as, for example, a mechanism that is similar to the GET and POST actions of HTTP. For example, a user's computer may generate an <iq> stanza to request a roster from the chat system 102, and may receive the requested roster in response. The user's computer may use an <iq> stanza to request the addition of another user to the user's roster.

Returning to FIG. 1, the document 110 may be transmitted over the Internet in textual form (e.g., as a binary ASCII text representation of an XMPP document) to the chat system 102. The chat system 102 may process the received document 110 and may provide the document 110, or an augmented version thereof, over a network (e.g., the Internet) to Mary's computer 112. The chat system 102 may similarly process XMPP documents from multiple other users and may provide the processed documents to appropriate recipient users.

XMPP documents can consume significant processing and memory resources in the chat system 102, for example, due to the identification of each portion of information in an XMPP document with opening and closing XML elements (also referred to herein as tags or data elements). In some instances, an XMPP document can be processed by multiple servers in the chat system 102, such as by a first server 116 and a second server 118 for example. As such, encoding XML data into a compressed binary format can conserve processing and memory resources. In some implementations, the servers 116 and 118 may be able to interpret the data in the compressed binary format without decoding the data into the text format.

The first server 116 in this example is a component of the chat system 102 that receives the document 110 from Dan's computer 106. The first server 116 includes an encoder 120 that processes the received document 110 to generate an encoded document 122. After the chat system 102 has processed the encoded document 122 (e.g., by identifying a user of the chat system 102 to which the encoded document 122 is to be routed, and by changing presence information for the user Dan 104), the second server 118 receives the encoded document 122. The network 114 may also include additional servers that process the encoded document 122.

In the example shown, the first server 116 and the second server 118 are separate components, though they may be incorporated into a single apparatus or may be implemented in multiple virtual machines on one or more physical devices. In other examples, the first server 116 and the second server 118 are incorporated within a cloud computing server system that includes a large number of individual server computers.

The second server 118 may include a decoder 124 that decodes the encoded document 122 to regenerate the document 110. In general, the decoder 124 may provide the inverse functionality as implemented by the encoder 120. In some examples, the regenerated document 110 includes data that supplements the original document 110 and that was provided by a sending user's computer. For example, the supplemented data may have been added by the chat system 102.

The encoder 120 can use a binary XML encoding scheme that represents data in an input XMPP document with four types of blocks: a "stream header" block, a "node" block, a "QName" block, and a "text" block. Each block can represent a format for encoding data, the data being of a type represented by the name of the respective block. Some of the blocks can include one or blocks, which may be the same as or different than the block in which they were included. Blocks can also include other parameters, as described below. The encoding scheme for these four types of blocks is described in turn.

Stream Header Block

A stream header block may begin an output document, for example, an XMPP output document that is stored on a computer-readable media. An example stream header block may include a plurality of parameters such as an "@" parameter and a "Known_Dictionary_Version" parameter. In this example, the format of the stream header block can take the form of:

Stream Header Block: [@, Known_Dictionary_Version].

The "@" symbol can designate a beginning of a binary-encoded XML output document, whereas the Known_Dictionary_Version parameter can specify a version of a dictionary used to encode known QNames in the input document. The Known_Dictionary_Version parameter may be any appropriate symbol that imparts meaning to the dictionary definition, such as an alphanumeric character. If multiple versions of a dictionary are used to encode a particular document, a most-recently used dictionary version may be specified in the stream header block. The use of a known dictionary is described in greater detail below. The example format may not encode the bracket or comma symbols shown above in the binary stream.

Node Block

A node block may be used to encode nodes (e.g., XML data elements) that are in a binary encoded XML output document. A separate node block may be included for each first-level node in the document. A node block can itself include other node blocks, for example, to represent second and third-level nodes (i.e., in a nested configuration). A node block can also include QName and Text blocks, as described below.

An example node block may include a plurality of parameters that include, for example, a "Header" parameter, a "Num_AttributeCount" parameter, a "Num_ChildCount" parameter, a "QName" parameter, an "Attributes" parameter, and a "Children" parameter. In turn, the "Attributes" parameter and the "Children" parameter may each respectively include a plurality of parameters. For example, the "Attributes" parameter may include a "QName" parameter and a "Text_AttributeValue" parameter, and the "Children" parameter may include a "Node" parameter or a "Text" parameter. A parameter itself may be defined as a node block, as described in further detail below. In this example, the format of the node block can be represented as:

Node Block: [Header, Num_AttributeCount, Num_ChildCount, QName, Attribute(s), Child(ren)], where:
Each Attribute: [QName, Text_AttributeValue]; and
Each Child: [Node] or [Text].

As shown above, the node block specifies a header, a zero or greater quantity of the node's attributes, a zero or greater quantity of the node's children, a QName for the node, and any of the node's attributes and children. Each child can be another node or text.

An example header format may be expressed as:
Node Block Header: [x, x, x, x, S, S, T, T].

The node block header may be represented by a byte. The "x" bits of the header do not have to be specified by the format and may be illustrated throughout this disclosure with a digital "low." The "S" bits can specify a type of encoding for numbers specified in the block format. For example, the "S" bits can specify whether the "Num_AttributeCount" field and "Num_ChildCount" field can each be encoded with a byte (i.e., 8 bits), short (i.e., 16 bits), or int (i.e., 32 bits) data field.

The data field that is specified can depend on a quantity of attributes and children in the message. For example, if a quantity of attributes in a message is less than or equal to 255, and a quantity of children in a message is less than or equal to 255, then the encoding system may represent each of the "Num_AttributeCount" field and the "Num_ChildCount" field with a single byte. A numerical value of "0, 0" in the node block header may indicate that the subsequent "Num_AttributeCount" field and "Num_ChildCount" fields are each a byte long. On the other hand, if at least one of the "Num_AttributeCount" field and "Num_ChildCount" field includes a number that is greater than 255, but is less than or equal to 65,535, the system can use "0, 1" in the "S, S" portion of the header so as to specify that a field 16 bits long will be used to represent the numerical value.

The "T" bits can specify a type of the block. For example, the bits "0, 0" can indicate that a block is a node block, the bits "0, 1" can indicate that a block is a QName block, and the bits "1, 0" can indicate that a block is a text block.

QName Block

A QName block can be used to encode QNames in the input document. A QName is an XML "qualified name" that can be an identifier for an element or attribute within an XML document. In other words, a QName may be the name of a tag in a document. For example, the data "<title>Example document title</title>" includes the QName "title."

A QName may include a "namespace" identifier in addition to a "local part" identifier. The namespace identifier may indicate the namespace to which the local part is assigned. As an illustration, two organizations may add tagged data to an XML document. Each organization, however, may use a similarly-named tag to indicate different semantics for content. As such, a namespace (e.g., "Organization_A" or "Organization_B") may be supplied with each local part tag in the format "Namespace: LocalPart." The addition of namespaces to local parts can distinguish between tags defined by Organization A and tags defined by Organization B. In some implementations, one or more QNames in a document will not include a namespace. In some implementations, a receiving system (e.g., chat system 102) can add a default namespace to elements and attributes in a received XML document that do not include a namespace.

In this example, the format of the QName block may be selected from multiple versions of the QName format, as described below:
Known_QName: [Header, Num_QNameReference];
Known_Namespace: [Header, Num_NamespaceReference, Text_LocalPart]; and
Inline: [Header, Text_Namespace, Text_LocalPart].

For each QName block, the encoder 120 accesses a Known QName Dictionary (also referred to as a table or a database). The Known QName Dictionary includes a listing of QNames (e.g., commonly-used QNames) and a reference for each QName (e.g., an index identifier for the QName). If the QName is found within the Known QName Dictionary, the "Known_QName" version of a QName block may be used. This version of the QName block includes a header and a parameter that is a numerical reference to the particular QName in the Known QName Dictionary.

If the QName is not found by the encoder 120 within the Known QName Dictionary, the encoder 120 can access a Known Namespace Dictionary. The Known Namespace Dictionary includes a listing of namespaces (e.g., commonly-used namespaces) and a reference for each namespace. If the namespace of the QName is found within the Known Namespace Dictionary, the "Known_Namespace" version of the QName block may be used. This version of the QName block includes a header, a numerical reference to the namespace in the Known Namespace Dictionary, and a text block that identifies a name for the local part of the QName.

If the QName or namespace is not found within either of the dictionaries, the encoder 120 can encode the QName using the "Inline" version of the QName block. This version of the QName block includes a header, a text block that identifies the namespace for the QName, and a text block that identifies the local part of the QName.

An example header format can be expressed as:
QName Block Header: [W, W, x, x, S, S, T, T].

In this example, the "W" bits can specify a version of the QName block that is used. For example, "0, 0" can indicate that the QName block is an Inline version of the block. "0, 1" can indicate a "Known_QName" version of the block and "1, 0" can indicate a "Known_Namespace" version of the block.

As described above, the "x" bits might not be specified. The "S" bits specify a size of the Num_QNameReference or Num_NamespaceReference field, and might not be specified in the inline version of the QName block. The "T" bits specify a type of the block.

Text Block

A text block can encode text into the output document. The first instance of text that is encoded into the output document may also be added to an inline text table. If the same text is listed in the document another time, the encoder can insert a reference to the text in the inline text table instead of encoding the text again. The reference may be shorter than the text, and result in a savings of storage space. The inline text table may be specific to the encoded document and may be included as part of the encoded document or identified by the encoded document. Each encoded document can be associated with its own inline text table, where the inline text table for each encoded document is different from inline text tables for other of the encoded documents.

An example text block may include a plurality of parameters including, for example, a "Header" parameter, a "Num_SizeOfData" parameter, a "Data" parameter, and a "Num_TextRef" parameter. In this example, the text block may be represented by:

Inline: [Header, Num_SizeOfData, Data]; and
Reference: [Header, Num_TextRef].

As mentioned above, the first time that text is encoded into the output document, the "Inline" version of the text block may be used. This version of the text block can include a header, a numerical identifier of a quantity of bytes in the data portion of the block, and a data portion of the block (e.g., a portion that specifies the text in ASCII). Further, the encoder 120 can store an indication of the inline text in an inline text table.

For each portion of text, the encoder 120 may select whether to use the "Inline" version of the text block or a "Reference" version of the text block by identifying whether the portion of text is already listed in the inline text table. If the text is not listed in the inline text table, the encoder 120 can use the "Inline" version of the text block, as described above.

If the text is referenced in the inline text table, the encoder 120 can use the "Reference" version of the text block. Such version of the text block can include a header and a numerical reference to the portion of text within the inline text table.

An example header format can be represented as:

Text Block Header: [x, x, x, R, S, S, T, T].

The "x" bits may be unspecified. The "R" bit may specify whether the text block is an "inline" version of the text block or a "reference" version of the text block, for example, with a "0" or "1" respectively. The "S" bits may specify a size of either the "Num_SizeOfData" field or the "Num_TextRef" field. The "T" bits may specify a type of the block.

Such blocks may be processed so as to create an encoded file of reduced size. For example, the encoder 120 may receive an XML document as input and may parse through the document, XML component by XML component, to encode the document contents into an encoded binary format. The conversion process may include encoding the contents of the input document using "Node," "QName," and "Text" routines for encoding respective blocks of the same name. The Node and QName routines can recursively call the same routine or another of the routines. An example of encoding of an input document into an output document is described below.

Figure 2:
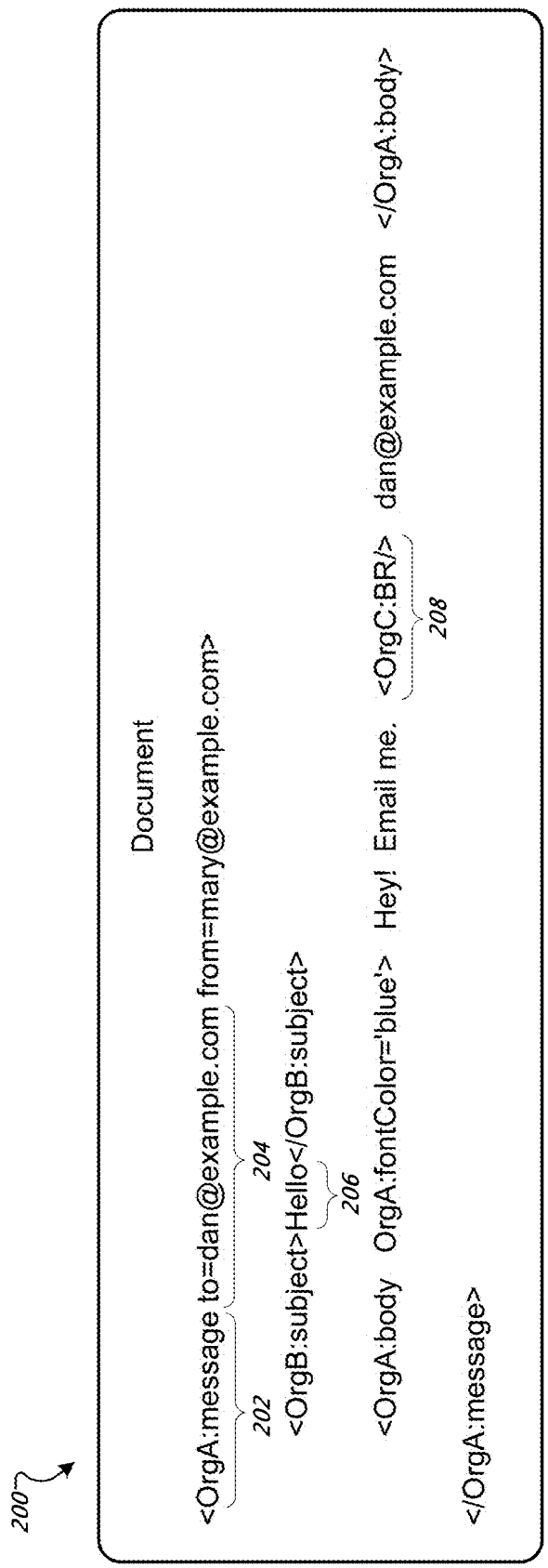
FIG. 2 shows an XML representation of a document that includes tagged data.

Referring now to FIG. 2, an XML representation of a document 200 (e.g., document 110 of FIG. 1) that includes tagged data is shown. In general, the document 200 may include various components or elements that are organized into markup and content. For example, the document 200 may include a QName 202 (e.g., "OrgA:message"), an attribute 204 (e.g., "to =dan@example.com"), a data value 206 (e.g., "Hello"), and a data element 208 (e.g., "<OrgC:BR/>"). As described in detail below, the encoder 120 of FIG. 1 can receive and encode the document 200. Additionally, the decoder 124 of FIG. 1 may be able to losslessly regenerate the content of the document 200 during a decoding process applied to an encoding of the document 200. A document may be losslessly regenerated when the regenerated document includes content that is identical to an original document before the encoding process. In other words, all of the original content may be recovered. In other implementations, all functional content can be recovered, but content that does not perform a function when, for example, the content of the document is process or executed, can be removed (e.g., remarks in content that is computer code).

FIGS. 3A-3H collectively show a process for converting the document 200 into a binary compressed output using the above-described Stream Header block, Node block, QName block, and Text block. The binary compressed output may be populated into an output document (e.g., encoded document 122) for transfer and/or storage.

With reference to FIG. 3A, the encoding of a document may begin by generating a stream header block. As described above, the stream header block 302 includes an "@" parameter 304 and a dictionary version identifier 306. In this example, the dictionary version identifier is represented by the alphanumeric character "3," signifying a most recent version of dictionary that is used to encode the QNames from input document 200. Accordingly, the first two elements of an output document 308 may include "@" and "3" (encoded in binary format), and may indicate to a decoder what dictionary version to use in decoding the output document.

After encoding the stream header block 302 into the beginning of the output document 308, the encoder 120 begins to parse through the input document 200. For example, the encoder 120 may read a first portion of the document 200 and identify the "<" character immediately preceding the sequence of characters "OrgA:message." The "<" character may indicate that the following sequence of characters "OrgA:message" begins a node. As such, the encoder 120 may begin to encode a node block 310 for the "OrgA:message" node. The "OrgA:message" node includes two attributes (i.e., the "to =dan@example.com" attribute and the "from=mary@example.com" attribute) and two nodes (i.e., the "OrgB:subject" node and the "OrgA:body" node). As such, and as described above, the node block 310 includes a header 312, an attribute count 314, a child count 316, a QName 318, a first attribute 320 (e.g., as discussed with reference to FIG. 3B), a second attribute 322 (e.g., as discussed with reference to FIG. 3C), a first child 360 (e.g., as discussed with reference to FIG. 3D), and a second child 366 (e.g., as discussed with reference to FIG. 3E).

Still referring to FIG. 3A, header 312 is represented in the output document 308 by a byte in the form of [x, x, x, x, S, S, T, T], where the bits "x, x, x, x" are arbitrary and may be defined as "0, 0, 0, 0," for example. The "S, S" bits of the header 312 can be determined by a size type determiner 402 (FIG. 4) of the encoder 120. The size type determiner 402 can perform at the request of a parser and binary message creator 405 which may manage the encoding processes and sub-systems implemented by the encoder 120, as well as processes and sub-systems associated with the transmission of the document 200 to and from various elements (e.g., as defined within diagram 100).

The size type determiner 402 determines the "S, S" bits in various types of headers. Depending on the type of header, the size type determiner 402 accesses different sub-components (e.g., components 404, 406, 421, and 429). In this example, the "S, S" bits refer to a size of the data field for the attribute count field 314 and the child count field 316. For example, the value of the "S, S" bits indicate whether the attribute count 314 and/or the child count 316 are of length "byte," "short," or "int."

To determine the length of the counts 314 and 316, the size type determiner 402 calls an attribute counter 404 and a child counter 406. The attribute counter 404 identifies a number of attributes within the node that is being encoded. For example, the "<OrgA:message>" node includes two attributes, "to =dan@example.com" and "from=mary@example.com," as shown in FIG. 2. In this example, the attribute counter 404 associates the number "2" with the attribute count 314. Similarly, the child counter 406 identifies a number of children within the node that is being encoded. For example, the "<OrgA:message>" node includes a first child node "<OrgB:subject>" and a second child node "<OrgA:body>," as shown in FIG. 2. Accordingly, the child counter 406 associates the number "2" with the child count 316. Sub-children may not be counted (e.g., the child "<OrgC:BR/>").

Since the number "2" may be represented by a byte (i.e., the number "2" is less than or equal to the number "255"), the size type determiner 402 may assign "0, 0" for the "S, S" portion of the header 312, as retrieved from a size type table 408. The value "0, 0" may indicate that the attribute count field 314 and the child count field 316 are each a byte long. If, for example, the attribute counter 404 had returned a value of "257" and the child counter had returned a value of "2," the greatest of the two respective returned values may control the assigned type. For example, the size type determiner 402 may assign "0, 1" for the "S, S" portion of the header 312 since a memory element of type "short" may be required to encode the value "257."

Figure 4:
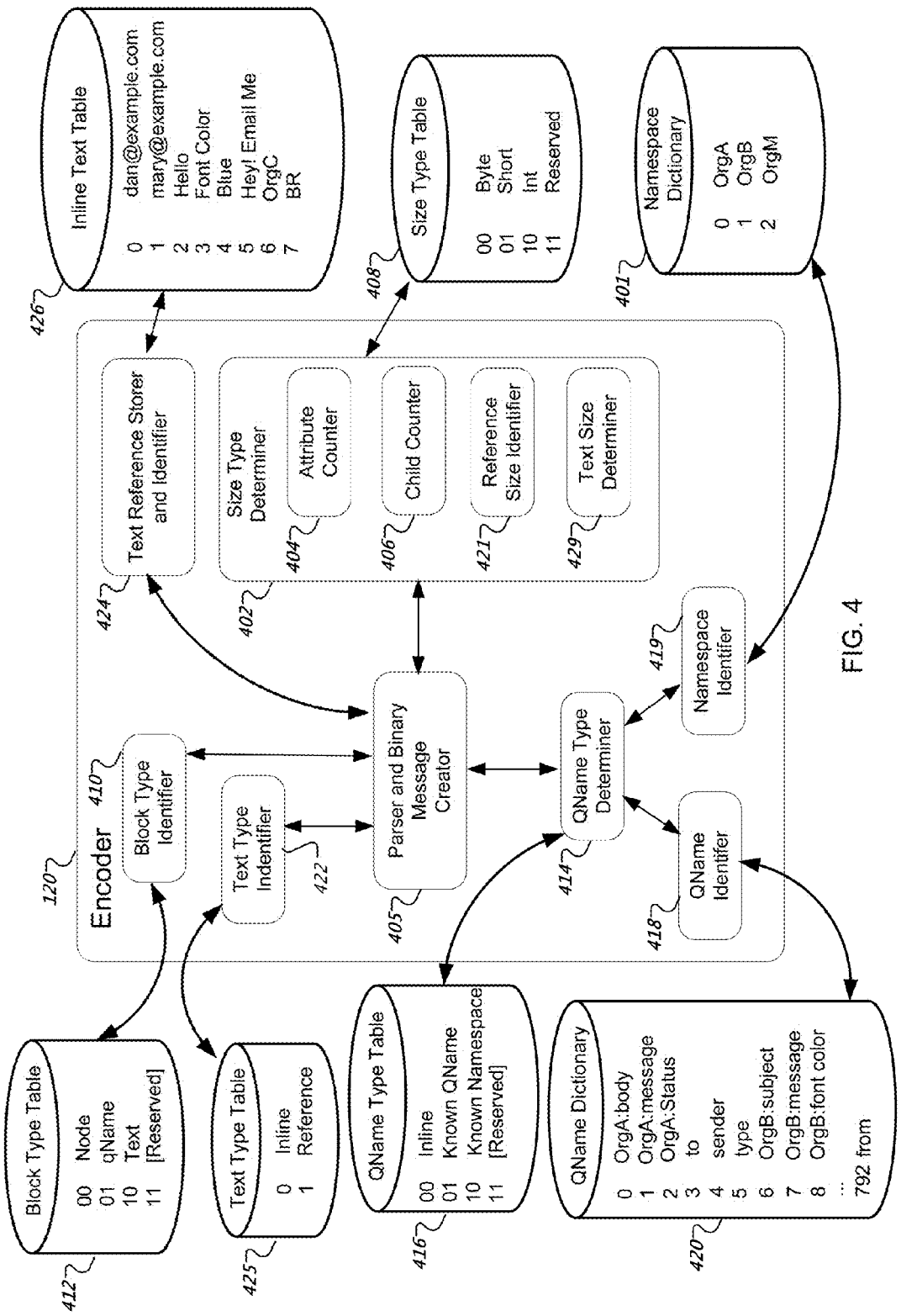
FIG. 4 shows a system for converting a document into a binary compressed output.

As mentioned above, header 312 is defined by a byte in the form of: [x, x, x, x, S, S, T, T]. The value of the "S, S" bits having been determined, the value for the bits "T, T" can be determined by a block type identifier 410 as shown in FIG. 4. In general, the block type identifier 410 determines a numerical value that identifies a type of a block (e.g., so that a processing system can determine the structure in which to decode or process data that follows the header). For example, the header 312 may be populated with the value "0, 0" for the bits "T, T" as found in a block type table 412, since the node block 310 is the "Node" type of block.

Subsequently, and based on corresponding values determined by the parser and binary message creator 405, the encoder 120 appends to the output document 308 the value "00000000" (binary) for the header 312, the value "2" (base ten) for the attribute count 314, and the value "2" (base ten) for the child count 316.

Still referring to FIG. 3A, the QName block 318, of the node block 310, includes a header 328 and a QName reference 330. The header 328 is defined by a byte of the form [W, W, x, x, S, S, T, T], where the bits "x, x," are arbitrary and may be defined as "0, 0" for example.

The "W, W" bits of the header 328 can be evaluated by a QName type determiner 414 (FIG. 4) of the encoder 120. The QName type determiner 414 may request that the QName Identifier 418 identify whether a QName is listed in the QName Dictionary 420 and, if not, may request that the namespace identifier 419 identify whether a namespace for the QName is listed in the Namespace Dictionary 401. In this example, the QName 318 has the content "orgA:Message." This QName is a "known" type (i.e., it is listed in the QName Dictionary 420). As such, the QName type determiner 414 retrieves, from the QName Type Table 416, the value "0, 1" for the bits "W, W" in order to specify that the QName block is encoded in the Known QName version. In this example, the QName Identifier 418 acquires a numerical reference "1" that identifies the known QName "OrgA:message" in the QName Dictionary 420. This value of "1" is included for the QName reference field 330 in the output document 308.

In some implementations, when a QName is not present within the QName Dictionary 420, the QName type determiner 414 may include a value "0, 0" for the bits "W, W" designating the subject QName as an "unknown" or "Inline" type. The unknown QName may subsequently be populated into the QName Dictionary 420 at a next available numerical reference entry (e.g., after the value "from").

The value of the "S, S" and "T, T" bits of the header 328 may be determined in a manner substantially similar to that described above in connection with the header 312. For example, the "S, S" bits may specify the size of a data field required to represent the QName reference 330 and, since the numerical reference "1" can be represented by a single byte, the size type determiner 402 may populates the "S, S" bits of the header 328 with "0, 0." Specifically, the size type determiner 402 may call the reference size identifier 421, which can identify a size of a reference in the QName Dictionary 420, Namespace Dictionary 401, or the Inline Text Table 426. Additionally, the "T, T" bits of the header 328 may be represented with "0, 1" since the QName block 318 is of the type "QName."

Subsequently, and based on corresponding values determined by the parser and binary message creator 405, the encoder 120 appends the value "01000001" (binary) for the header 328, and the value "1" (base ten) for the QName Ref 330 to the output document 308, as shown in FIG. 3A.

As mentioned above, the node block 310 also includes a first attribute 320, a second attribute 322, a first child 360, and a second child 366. Referring now to FIG. 3B, a procedure for generating a binary compressed output in accordance with the first attribute 320 of the node block 310 is shown. In this example, the string "to =dan@example.com" is the first attribute 320.

As described above, an attribute of a node block may be represented as: [QName, Text_AttributeValue]. In this example, the encoder 120 resolves that the first attribute 320 includes a QName 332 (i.e., "to") and an attribute entry 334 (i.e., "dan@example.com"). The QName 332 is encoded using a QName block. A QName block is encoded with a header 336 and a QName reference 338.

The header 336 is defined by a byte of the form [W, W, x, x, S, S, T, T], where the bits "x, x," are arbitrarily defined, and the "W, W" and "S, S" and "T, T" bits of the header 336 are determined in a manner substantially similar to that described above in connection with the header 328. For example, the "W, W" bits of the header 336 can be evaluated as "0, 1" by the QName type determiner 414 of the encoder 120. The QName identifier 418 acquires a numerical reference "3" associated with the known QName "to" from the QName Dictionary 420 and assigns this numerical value to the QName reference 338. The "S, S" bits specify a data field size required to represent the QName reference 338. Since the numerical reference "3" may be represented by a byte, the size type determiner 402 populates the "S, S" bits of the header 336 with the value "0, 0" (as selected from the size type table 408). Additionally, the "T, T" bits of the header 328 are represented by "0, 1" since the since the QName block 332 is identified as the type "QName" (as selected from the block type table 412).

Subsequently, and based on corresponding values determined by the parser and binary message creator 405 of the encoder 120, the encoder 120 appends the value "01000001" (binary) for the header 336, and the value "3" (base ten) for the QName reference 338, to the output document 308, as shown in FIG. 3B Still referring to FIG. 3B, the attribute entry 334 is represented with a Text Block. As discussed above, a Text Block includes a header 340, a size parameter 342, and a data field 344. (The terms parameter and field may be used interchangeably throughout this disclosure, and may both refer to a reserved allocation of memory that can be filled with a data value). As mentioned above, the header of a text block (e.g., header 340) may be defined by a byte of the form [x, x, x, R, S, S, T, T], where the bits "x, x," are arbitrarily defined.

The "R" bit of the header 328 can be assigned by a text type identifier 422 of the encoder 120. In this example, the text type identifier 422 determines that the text "dan@example.com" of the attribute entry 334 is a first instance of this string in the document, and assigns a value "0" to the "R" bit of the header 328 based on the definition of an "Inline" type within a text type table 428. More specifically, use of the "Inline" type specifies that the text "dan@example.com" has not been previously encountered within the document 200. This may be accomplished, for example, by the parser and binary message creator 405 via a text reference storer and identifier 424. For example, the text reference storer and identifier 424 may query an inline text table 426 and determine that the text "dan@example.com" has not been previously encountered within the document 200. The reference storer and identifier 424 may then populate the inline text table 426 with the string "dan@example.com" and assign this string a reference value (e.g., "0"). The next time that the string "dan@example.com" is encountered, the text type identifier 422 may determine that the text "dan@example.com" is not the first instance of the string, and may assign a value "1" to the "R" bit of the header 328 based on the definition of a "Reference" type within the text type table 428. In this manner, the encoder 120 can apply this "reference" to all subsequent versions of this text.

The value of the "S, S" and "T, T" bits of the header 340 may be determined in a manner substantially similar to that described above in connection with the header 312. For example, the "S, S" bits may specify the size of a data field required to represent the data field 344. Since the numerical value "15," which corresponds to the number of characters (e.g., bytes) within the string "dan@example.com," may be represented by a byte, the size type determiner 402 may populate the "S, S" bits of the header 340 with "0, 0." In this example, the numerical value "15" may be determined by a text size determiner 429 of the size type determiner 402. Additionally, the "T, T" bits of the header 340 may be represented by "1, 0" since the attribute entry 334 is known to be of type "Text" block.

Subsequently, and based on corresponding values determined by the parser and binary message creator 405 of the encoder 120, the encoder 120 appends the value "00000010" (binary) for the header 340, value "15" (base ten) for the size parameter 342, and value "dan@example.com" (string) for the data field 344 to the output document 308, as shown in FIG. 3B.

Referring now to FIG. 3C, a procedure for generating a binary compressed output in accordance with the second attribute 322 of the node block 310 is shown. In this example, the string "from=mary@example.com" corresponds to the second attribute 322. The procedure is similar to that described with respect to the first attribute 320.

For example the encoder 120 may resolve that the second attribute 322 is represented with a QName block 346 (i.e., "From") and an attribute entry 348 (i.e., "mary@example.com"). The QName block 346 is represented with a header 350 and a QName reference 352.

The header 350 is defined by a byte of the form [W, W, x, x, S, S, T, T], where the bits "x, x," are arbitrarily defined, and the "W, W" and "S, S" and "T, T" bits of the header 350 are determined a manner substantially similar to that described above in connection with the header 350. For example, the "W, W" bits of the header 350 can be evaluated as "0, 1" by the QName type determiner 414 of the encoder 120. The QName identifier 418 additionally acquires a numerical reference "792" associated with the known QName "from" from the QName Dictionary 420 and assigns this numerical value to the QName reference 352. The "S, S" bits specify a data field size required to represent the QName reference 352 and, since the numerical reference "792" may be represented by a short memory type, the size type determiner 402 populates the "S, S" bits of the header 350 with "0, 1" value (as selected from the size type table 408). Additionally, the "T, T" bits of the header 350 are evaluated as "0, 1" since the since the QName block 346 is known to be of type "QName."

Subsequently, and based on corresponding values determined by the parser and binary message creator 405 of the encoder 120, the encoder 120 appends the value "01000101" (binary) for the header 350, and the value "792" (base ten) for the QName reference 352, to the output document 308, as shown in FIG. 3C.

The attribute entry Text Block 348 includes a header 354, a size parameter 356, and a data field 358. The "R" bit of the header 328 can be assigned by the text type identifier 422 of the encoder 120 as shown in FIG. 4. In this example, the text type identifier 422 determines that the text "mary@example.com" of the attribute entry 348 is a first instance of this string, and assigns a value "0" to the "R" bit of the header 328 based on the definition of an "Inline" type within the text type table 425.

The value of the "S, S" and "T, T" bits of the header 354 may be determined in a manner substantially similar to that described above in connection with the header 340. For example, the "S, S" bits may specify the size of a data field required to represent the data field 358. Since the numerical value "16," which corresponds to the number of characters within the string "mary@example.com," may be represented by a byte, the size type determiner 402 may populate the "S, S" bits of the header 354 with "0, 0." Additionally, the "T, T" bits of the header 354 may be evaluated as "1, 0" since the attribute entry 348 is known to be of type "Text" block. Accordingly, the value "00000010" (binary) is output for the header field 354, the value "16" (base ten) is output for the size field 356, and the value "mary@example.com" (string) is output for the data field.

Referring to FIG. 3D, the encoder 120 continues processing document 200 by encoding the "OrgB:subject" child node to the "OrgA:message" node as "OrgB:subject" node block 360. The "OrgB:subject" node does not include any attributes and includes a single child (i.e., the text "Hello"). The bits for the header field are generated as discussed throughout this disclosure. As such, the encoder 120 outputs "00000000" (binary), "0" (base-10), and "1" (base10) for the first three fields of the "OrgB:subject" node block 360. The fourth field of the orgB:subject node is a QName block 362. The QName block 362 includes a header field that is represented with the value "10000001." The "WW" bits are represented with the value "01" from the QName Type Table 416 because the QName "orgB:subject" is identified by index value "6" in the QName Dictionary 420.

The "OrgB:subject" node block 360 also includes a first child node 364. The child node 364 represents the text "Hello" 206 from the document 200 and, as such, will be defined by the encoder 120 using a text block. As described throughout the disclosure, a text block includes a header byte, a size of data field, and a data field. Accordingly, the header is represented with the value "00000010" (binary). The size of data field, which can indicate a quantity of bytes of the data, is represented with the value "5" (base-10). The data field is represented with the value "Hello" (string).

As shown in FIG. 3E, the encoder 120 continues the processing by encoding the "OrgA:body" child node in document 200 with node field 366. This child node includes one attribute ("OrgA:fontColor='blue') and three child nodes (the "Hey! Email me." text; the "OrgC:BR" node; and the "dan@example.com" text). As such, the fields included in the node block 366 are the header, attribute count, child count, QName, first attribute 368, first child 374, second child 376, and third child 384. The encoder 120 determines that the values for the first three fields include "00000000" (binary), "1" (base-10), "3" (base-10), and, for the QName field, "01000001" (binary), and "0" (base-10), as determined using encoding process described herein.

FIG. 3F continues an illustration of the encoding of the "OrgA:body" node block 366. As described above, the "OrgA:body" node includes a single attribute, the "OrgA: fontColor='blue'" attribute, represented by attribute field 368. In this example, the QName "OrgA:fontColor" for the QName block 369 cannot be located in the QName Dictionary 420, but the namespace identifier 419 can identify the namespace "OrgA" in the Namespace Dictionary 401. As such, the "WW" bits in the header are set to the "10" value from the QName Type Table 416 so as to represent that the QName has a known namespace. The namespace reference 370 field is represented with the value "0" to identify the "OrgA" value from the Namespace Dictionary 401.

As discussed above, the local part of the QName is specified with a Text block 372 when the entire QName is not known, but the namespace is known. The text block 372 is of the "inline" type and encodes the data "font color" with nine bytes. Accordingly, the encoder 120 outputs the values "00000010" (binary), "9" (base-10), and "font color" (string). The "OrgA:fontColor" attribute field 368 also includes a text block 373 for specifying the attribute value (i.e., the text "blue"). The encoder 120 encodes this text as "00000010" (binary), "4" (base-10), and "blue" (string) using the processes described herein.

The "orgA:body" node 366 also includes three children: the text "Hey! Email Me." (encoding shown in FIG. 3G), the node "OrgC:BR" (encoding shown in FIG. 3H), and the text "dan@example.com" (encoding shown in FIG. 3I).

With reference to FIG. 3G, the text "Hey! Email Me." is encoded with the text block 374 using the processes already described herein.

With reference to FIG. 3H, the node "<OrgC:BR/>" is encoded with the "OrgC:BR" node block 376. The node "<OrgC:BR/>" does not include any attributes or children and, as such, the header, attribute count, and child count fields are represented with the values "00000000" (binary), "0" (base-10), and "0" (base-10), respectively. The QName "OrgC:BR" is not stored in the QName Dictionary 420, nor is the Namespace "OrgC" stored in the Namespace Dictionary 401. As such, the QName block 378 is the "inline" version, specified using the header "W, W" bits of "0, 0." Accordingly, the QName block 378 includes a text block 380 that specifies the encoding of the namespace "OrgC." The QName block 378 further includes a text block 382 that specifies the encoding of the local part "BR."

With reference to FIG. 3I, the child text "dan@example.com" is encoded with the text block 384. The text reference storer and identifier 424 identifies that the text "dan@example.com" is stored in the inline text table 426 under index "0." Accordingly, the text type identifier 422 selects the text type value of "1" from the text type table 425 to represent that the text block will be a "Reference" version of the text block. Consequently, the encoder 120 outputs the value "00010010" (binary) and "0" (base-10).

Figure 5:
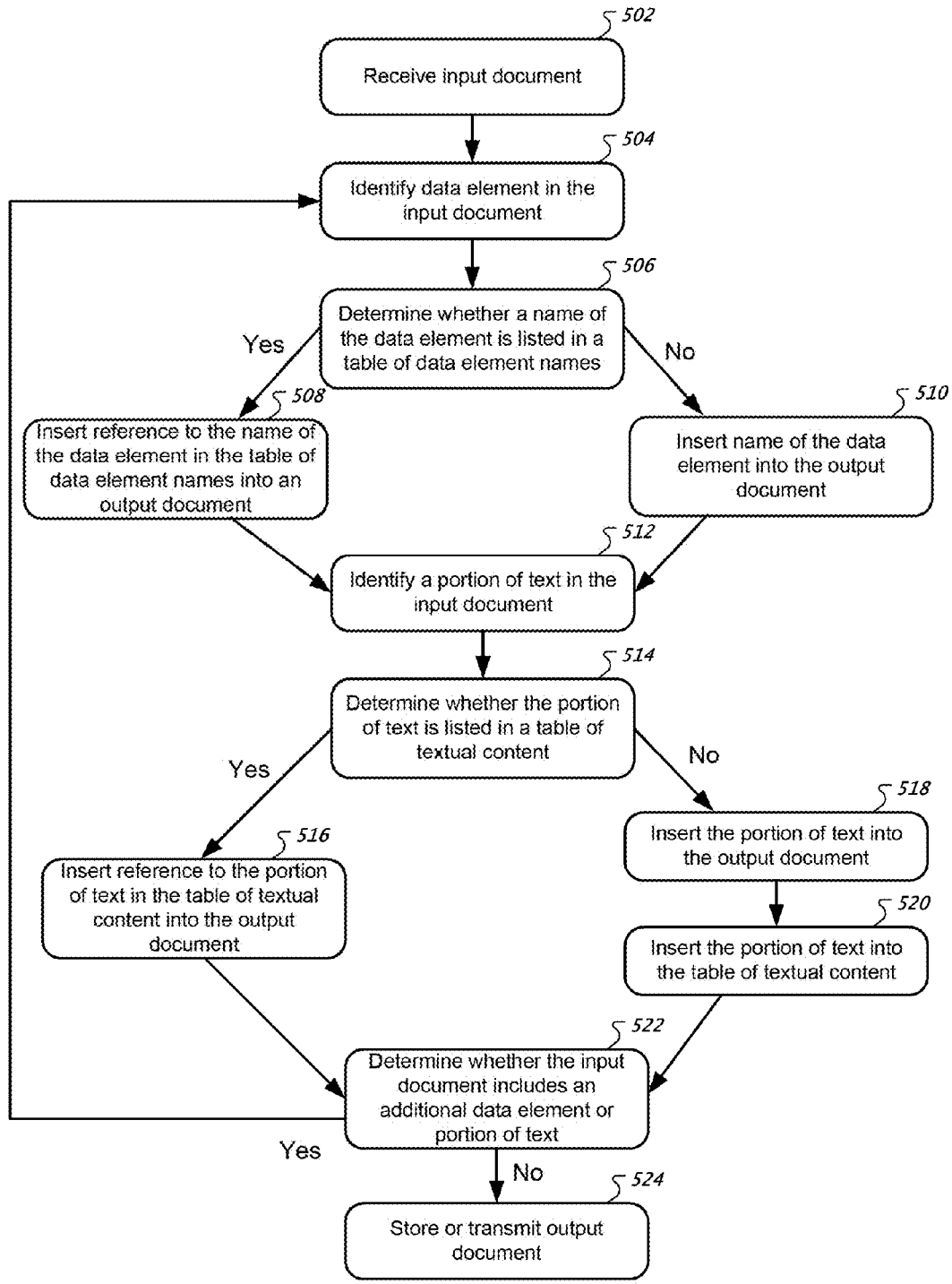
FIG. 5 shows a flowchart of an example process for encoding a document.

FIG. 5 shows a flowchart of an example process for encoding a document. In box 502, a computing system receives an input document. For example, the first server 116 may receive the document 110. The computing system may include one or more computing devices that each include one or more computer-readable devices executed by one or more corresponding processors. The received document can include data elements that identify semantics of corresponding data values in the input document. A data element may alternatively be referred to in this disclosure as a tag. A type of data element may be an XML data element. The input document 110 may include different types of data elements. Each data element can include an opening tag and a closing tag (e.g., the tags <message> and </message>). Text between the opening tag and the closing tag can be a data value that has a meaning that is specified by the data element.

In box 504, the computing system identifies a data element in the input document. For example, the computing system may parse through the input document in a sequential manner and identify the XML data element <message> as a first XML data element in the input document.

In box 506, the computing system determines whether a name of the data element is listed in a table of data element names. For example, the QName identifier 418 can access the QName dictionary 420 to identify whether the name of the data element is listed in the QName dictionary 420. The identification process can include determining whether the name of the data element matches a data element listed in the QName dictionary. A value of a data element and a value in the QName dictionary may "match" when the value are the same or are determined to be similar (e.g., the values may be the same when both values are converted to only lower-case letters).

In box 508, the computing system has determined that the name of the data element is listed in the table of data element names. As such, the computing system inserts a reference to the name of the data element from the table of data element names into an output document. The reference may include an index of the name of the data element in the table of the data element names (e.g., "132"), or a non-index identifier that accompanies the name of the data element in the table of the data element names.

In box 510, the computing system has determined that the name of the data element is not listed in the table of data element names. As such, the computing system inserts the name of the data element into the output document. The name of the data element may not be the same as the above-described reference to the name of the data element.

In some implementations, the list of data element names also includes names for data element attributes and the operations of boxes 506, 508, and 510 further apply to encoding a data element attribute into an output document.

In box 512, the computing system identifies a portion of text in the input document. The portion of text may be a value for a data element or a data element name that is not identified in the table of data element names (as described with respect to box 510). In some implementations, the portion of text may be an attribute value that is not identified in the table of data element names.

In box 514, the computing system determines whether the portion of text is listed in a table of textual content. For example, the text reference storer and identifier 424 can determine whether the identified portion of text is listed in the inline text table 426.

In box 516, the computing system has determined that the portion of text is listed in the table of textual content. As such, the computing system inserts a reference to the portion of text from the table of textual content into the output document. The reference may include an index to the text in the table of textual content, or a non-index identifier that accompanies the text in the table of textual content. The text may have been added to the table of textual content during the encoding of the input document into the output document, as described with respect to box 520.

In box 518, the computing system has determined that the portion of text is not listed in the table of textual content. As such, the computing system inserts the portion of text into the output document.

In box 520, the computing system inserts the portion of text into the table of textual content. For example, the text reference storer and identifier 424 inserts the portion of text into the inline text table 426. As such, the encoder 120 can insert into the output document, for a subsequent occurrence of the portion of text, a reference to the portion of text in the inline text table instead of including in the output document another instance of the portion of text. As such, the output document may include no more than a single instance of the portion of text, even though the input document may include multiple instances of the portion of text.

In box 522, the computing system determines whether the input document includes an additional data element or portion of text. For example, the encoder 120 may determine if the input document 110 has been fully processed. If the input document includes an additional data element or portion of text, the computing system performs the operations of boxes 504 through 522 with a different data element and/or a different portion of text. If the input document does not include an additional data element or portion of text, the computing system performs the operations of box 524.

In box 524, the computing system stores the output document and/or transmits the output document. For example, the computing system may store the output document, including any data element names, data element references, text portions, and references to text portions, in a representation of the document in computer-readable memory. The computing system may additionally or alternative transmit the document to another computing system. For example, the chat system 102 may transmit the document over the Internet to Mary's computer 112.

As described throughout this disclosure, the table of textual content may be generated during the processing of an input document into an output document. In contrast, the table of data element names may preexist the described processing of the input document. The same table of data element names may be used during the processing of multiple different input documents. The system may generate a different table of textual content for each input document processed.

Indeed, the table of textual content may be able to be generated or regenerated from either the input document or the output document. In other words, a computing system may be able to construct a table of textual content from an input document or an output document, as the input and output documents may not only include the textual content, but may further include the textual content in the order in which the textual content is listed in the table. The encoded document may include the table of textual content or include a reference that enables a computing system to locate the table of textual content.

On the other hand, the table of data element names may include names of data elements that are not included in an input or output document for which the table of data element names is used. Further, the ordering of the data element names in the table of data element names may be different than an order in which some of the data element names in the table appear in an input document. Although this disclosure refers to XML, the mechanisms herein may apply to other formats in which data in a document is identified by tags.

Figure 6:
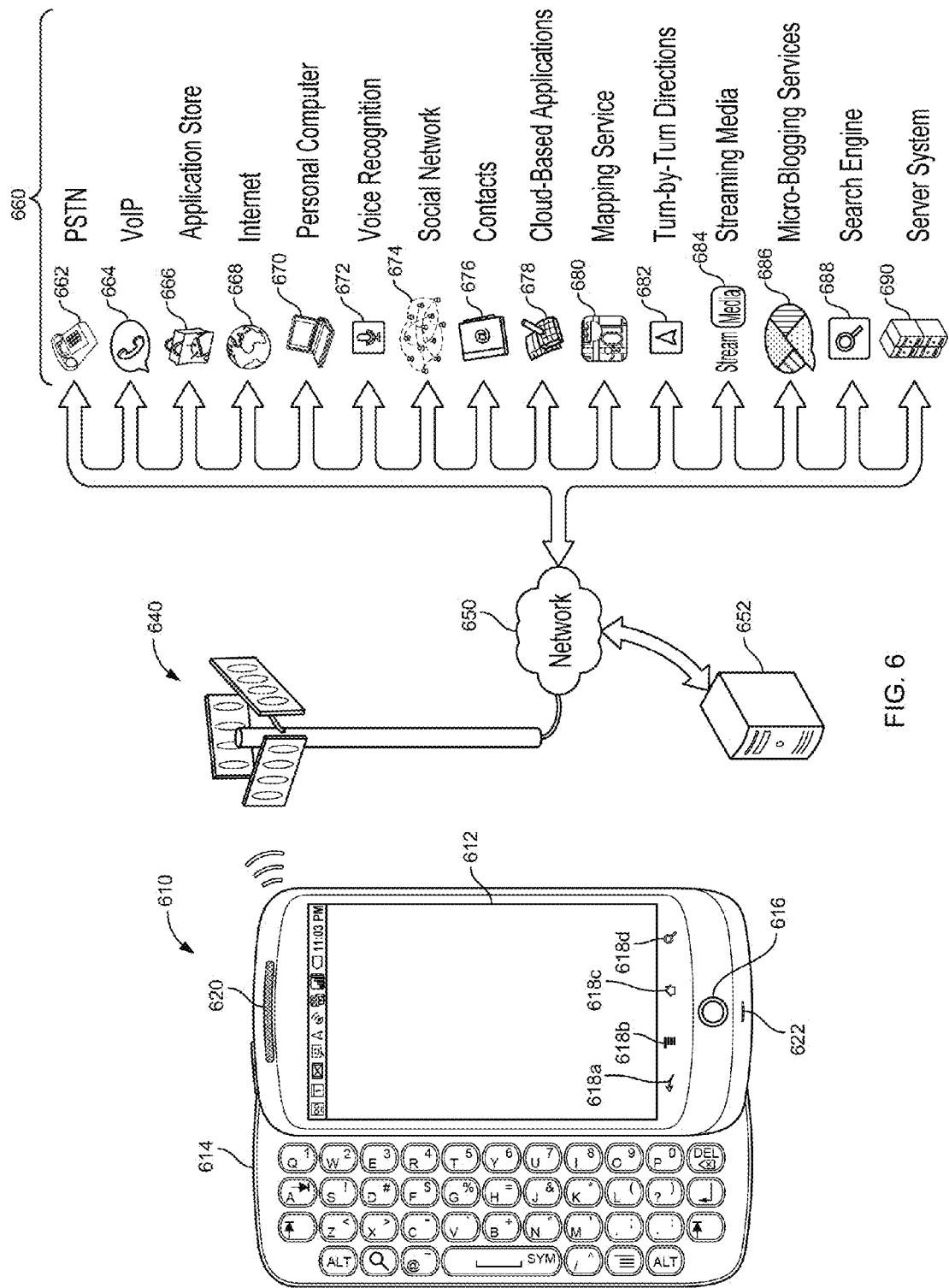
FIG. 6 is a conceptual diagram of a system that may be used to implement the systems and methods described in this document.

Referring now to FIG. 6, a conceptual diagram of a system that may be used to implement the systems and methods described in this document is illustrated. In the system, mobile computing device 610 can wirelessly communicate with base station 640, which can provide the mobile computing device wireless access to numerous hosted services 660 through a network 650.

In this illustration, the mobile computing device 610 is depicted as a handheld mobile telephone (e.g., a smartphone, or an application telephone) that includes a touchscreen display device 612 for presenting content to a user of the mobile computing device 610 and receiving touch-based user inputs. Other visual, tactile, and auditory output components may also be provided (e.g., LED lights, a vibrating mechanism for tactile output, or a speaker for providing tonal, voice-generated, or recorded output), as may various different input components (e.g., keyboard 614, physical buttons, trackballs, accelerometers, gyroscopes, and magnetometers).

Example visual output mechanism in the form of display device 612 may take the form of a display with resistive or capacitive touch capabilities. The display device may be for displaying video, graphics, images, and text, and for coordinating user touch input locations with the location of displayed information so that the device 610 can associate user contact at a location of a displayed item with the item. The mobile computing device 610 may also take alternative forms, including as a laptop computer, a tablet or slate computer, a personal digital assistant, an embedded system (e.g., a car navigation system), a desktop personal computer, or a computerized workstation.

An example mechanism for receiving user-input includes keyboard 614, which may be a full qwerty keyboard or a traditional keypad that includes keys for the digits '0-9', '*', and '#.' The keyboard 614 receives input when a user physically contacts or depresses a keyboard key. User manipulation of a trackball 616 or interaction with a track pad enables the user to supply directional and rate of movement information to the mobile computing device 610 (e.g., to manipulate a position of a cursor on the display device 612).

The mobile computing device 610 may be able to determine a position of physical contact with the touchscreen display device 612 (e.g., a position of contact by a finger or a stylus). Using the touchscreen 612, various "virtual" input mechanisms may be produced, where a user interacts with a graphical user interface element depicted on the touchscreen 612 by contacting the graphical user interface element. An example of a "virtual" input mechanism is a "software keyboard," where a keyboard is displayed on the touchscreen and a user selects keys by pressing a region of the touchscreen 612 that corresponds to each key.

The mobile computing device 610 may include mechanical or touch sensitive buttons 618*a-d*. Additionally, the mobile computing device may include buttons for adjusting volume output by the one or more speakers 620, and a button for turning the mobile computing device on or off. A microphone 622 allows the mobile computing device 610 to convert audible sounds into an electrical signal that may be digitally encoded and stored in computer-readable memory, or transmitted to another computing device. The mobile computing device 610 may also include a digital compass, an accelerometer, proximity sensors, and ambient light sensors.

An operating system may provide an interface between the mobile computing device's hardware (e.g., the input/output mechanisms and a processor executing instructions retrieved from computer-readable medium) and software. The operating system may provide a platform for the execution of application programs that facilitate interaction between the computing device and a user.

The mobile computing device 610 may present a graphical user interface with the touchscreen 612. A graphical user interface is a collection of one or more graphical interface elements and may be static (e.g., the display appears to remain the same over a period of time), or may be dynamic (e.g., the graphical user interface includes graphical interface elements that animate without user input).

A graphical interface element may be text, lines, shapes, images, or combinations thereof. For example, a graphical interface element may be an icon that is displayed on the desktop and the icon's associated text. In some examples, a graphical interface element is selectable with user-input. For example, a user may select a graphical interface element by pressing a region of the touchscreen that corresponds to a display of the graphical interface element. In some examples, the user may manipulate a trackball to highlight a single graphical interface element as having focus. User-selection of a graphical interface element may invoke a pre-defined action by the mobile computing device. In some examples, selectable graphical interface elements further or alternatively correspond to a button on the keyboard 604. User-selection of the button may invoke the pre-defined action.

In some examples, the operating system provides a "desktop" graphical user interface that is displayed after turning on the mobile computing device 610, after activating the mobile computing device 610 from a sleep state, after "unlocking" the mobile computing device 610, or after receiving user-selection of the "home" button 618c. The desktop graphical user interface may display several graphical interface elements that, when selected, invoke corresponding application programs. An invoked application program may present a graphical interface that replaces the desktop graphical user interface until the application program terminates or is hidden from view.

User-input may influence an executing sequence of mobile computing device 610 operations. For example, a single-action user input (e.g., a single tap of the touchscreen, swipe across the touchscreen, contact with a button, or combination of these occurring at a same time) may invoke an operation that changes a display of the user interface. Without the user-input, the user interface may not have changed at a particular time. For example, a multi-touch user input with the touchscreen 612 may invoke a mapping application to "zoom-in" on a location, even though the mapping application may have by default zoomed-in after several seconds.

The desktop graphical interface can also display "widgets." A widget is one or more graphical interface elements that are associated with an application program that is executing, and that display on the desktop content controlled by the executing application program. A widget's application program may launch as the mobile device turns on. Further, a widget may not take focus of the full display. Instead, a widget may only "own" a small portion of the desktop, displaying content and receiving touchscreen user-input within the portion of the desktop.

The mobile computing device 610 may include one or more location-identification mechanisms. A location-identification mechanism may include a collection of hardware and software that provides the operating system and application programs an estimate of the mobile device's geographical position. A location-identification mechanism may employ satellite-based positioning techniques, base station transmitting antenna identification, multiple base station triangulation, Internet access point IP location determinations, inferential identification of a user's position based on search engine queries, and user-supplied identification of location (e.g., by receiving user a "check in" to a location).

The mobile computing device 610 may include other applications, computing sub-systems, and hardware. A call handling unit may receive an indication of an incoming telephone call and provide a user the capability to answer the incoming telephone call. A media player may allow a user to listen to music or play movies that are stored in local memory of the mobile computing device 610. The mobile device 610 may include a digital camera sensor, and corresponding image and video capture and editing software. An Internet browser may enable the user to view content from a web page by typing in an addresses corresponding to the web page or selecting a link to the web page.

The mobile computing device 610 may include an antenna to wirelessly communicate information with the base station 640. The base station 640 may be one of many base stations in a collection of base stations (e.g., a mobile telephone cellular network) that enables the mobile computing device 610 to maintain communication with a network 650 as the mobile computing device is geographically moved. The computing device 610 may alternatively or additionally communicate with the network 650 through a Wi-Fi router or a wired connection (e.g., ETHERNET, USB, or FIREWIRE). The computing device 610 may also wirelessly communicate with other computing devices using BLUETOOTH protocols, or may employ an ad-hoc wireless network.

A service provider that operates the network of base stations may connect the mobile computing device 610 to the network 650 to enable communication between the mobile computing device 610 and other computing systems that provide services 660. Although the services 660 may be provided over different networks (e.g., the service provider's internal network, the Public Switched Telephone Network, and the Internet), network 650 is illustrated as a single network. The service provider may operate a server system 652 that routes information packets and voice data between the mobile computing device 610 and computing systems associated with the services 660.

The network 650 may connect the mobile computing device 610 to the Public Switched Telephone Network (PSTN) 662 in order to establish voice or fax communication between the mobile computing device 610 and another computing device. For example, the service provider server system 652 may receive an indication from the PSTN 662 of an incoming call for the mobile computing device 610. Conversely, the mobile computing device 610 may send a communication to the service provider server system 652 initiating a telephone call using a telephone number that is associated with a device accessible through the PSTN 662.

The network 650 may connect the mobile computing device 610 with a Voice over Internet Protocol (VoIP) service 664 that routes voice communications over an IP network, as opposed to the PSTN. For example, a user of the mobile computing device 610 may invoke a VoIP application and initiate a call using the program. The service provider server system 652 may forward voice data from the call to a VoIP service, which may route the call over the Internet to a corresponding computing device, potentially using the PSTN for a final leg of the connection.

An application store 666 may provide a user of the mobile computing device 610 the ability to browse a list of remotely stored application programs that the user may download over the network 650 and install on the mobile computing device 610. The application store 666 may serve as a repository of applications developed by third-party application developers.

An application program that is installed on the mobile computing device 610 may be able to communicate over the network 650 with server systems that are designated for the application program. For example, a VoIP application program may be downloaded from the Application Store 666, enabling the user to communicate with the VoIP service 664.

The mobile computing device 610 may access content on the Internet 668 through network 650. For example, a user of the mobile computing device 610 may invoke a web browser application that requests data from remote computing devices that are accessible at designated universal resource locations. In various examples, some of the services 660 are accessible over the Internet.

The mobile computing device may communicate with a personal computer 670. For example, the personal computer 670 may be the home computer for a user of the mobile computing device 610. Thus, the user may be able to stream media from his personal computer 670. The user may also view the file structure of his personal computer 670, and transmit selected documents between the computerized devices.

A voice recognition service 672 may receive voice communication data recorded with the mobile computing device's microphone 622, and translate the voice communication into corresponding textual data. In some examples, the translated text is provided to a search engine as a web query, and responsive search engine search results are transmitted to the mobile computing device 610.

The mobile computing device 610 may communicate with a social network 674. The social network may include numerous members, some of which have agreed to be related as acquaintances. Application programs on the mobile computing device 610 may access the social network 674 to retrieve information based on the acquaintances of the user of the mobile computing device. For example, an "address book" application program may retrieve telephone numbers for the user's acquaintances. In various examples, content may be delivered to the mobile computing device 610 based on social network distances from the user to other members in a social network graph of members and connecting relationships. For example, advertisement and news article content may be selected for the user based on a level of interaction with such content by members that are "close" to the user (e.g., members that are "friends" or "friends of friends").

The mobile computing device 610 may access a personal set of contacts 676 through network 650. Each contact may identify an individual and include information about that individual (e.g., a phone number, an email address, and a birthday). Because the set of contacts is hosted remotely to the mobile computing device 610, the user may access and maintain the contacts 676 across several devices as a common set of contacts.

The mobile computing device 610 may access cloud-based application programs 678. Cloud-computing provides application programs (e.g., a word processor or an email program) that are hosted remotely from the mobile computing device 610, and may be accessed by the device 610 using a web browser or a dedicated program.

Mapping service 680 can provide the mobile computing device 610 with street maps, route planning information, and satellite images. The mapping service 680 may also receive queries and return location-specific results. For example, the mobile computing device 610 may send an estimated location of the mobile computing device and a user-entered query for "pizza places" to the mapping service 680. The mapping service 680 may return a street map with "markers" superimposed on the map that identify geographical locations of nearby "pizza places."

Turn-by-turn service 682 may provide the mobile computing device 610 with turn-by-turn directions to a user-supplied destination. For example, the turn-by-turn service 682 may stream to device 610 a street-level view of an estimated location of the device, along with data for providing audio commands and superimposing arrows that direct a user of the device 610 to the destination.

Various forms of streaming media 684 may be requested by the mobile computing device 610. For example, computing device 610 may request a stream for a pre-recorded video file, a live television program, or a live radio program.

A micro-blogging service 686 may receive from the mobile computing device 610 a user-input post that does not identify recipients of the post. The micro-blogging service 686 may disseminate the post to other members of the micro-blogging service 686 that agreed to subscribe to the user.

A search engine 688 may receive user-entered textual or verbal queries from the mobile computing device 610, determine a set of Internet-accessible documents that are responsive to the query, and provide to the device 610 information to display a list of search results for the responsive documents. In examples where a verbal query is received, the voice recognition service 672 may translate the received audio into a textual query that is sent to the search engine.

These and other services may be implemented in a server system 690. A server system may be a combination of hardware and software that provides a service or a set of services. For example, a set of physically separate and networked computerized devices may operate together as a logical server system unit to handle the operations necessary to offer a service to hundreds of computing devices. A server system is also referred to herein as a computing system.

In various implementations, operations that are performed "in response to" or "as a result of" another operation (e.g., a determination or an identification) are not performed if the prior operation is unsuccessful (e.g., if the determination was not performed). Operations that are performed "automatically" are operations that are performed without user intervention (e.g., intervening user input). Features in this document that are described with conditional language may describe implementations that are optional. In some examples, "transmitting" from a first device to a second device includes the first device placing data into a network for receipt by the second device, but may not include the second device receiving the data. Conversely, "receiving" from a first device may include receiving the data from a network, but may not include the first device transmitting the data.

"Determining" by a computing system can include the computing system requesting that another device perform the determination and supply the results to the computing system. Moreover, "displaying" or "presenting" by a computing system can include the computing system sending data for causing another device to display or present the referenced information.

Figure 7:
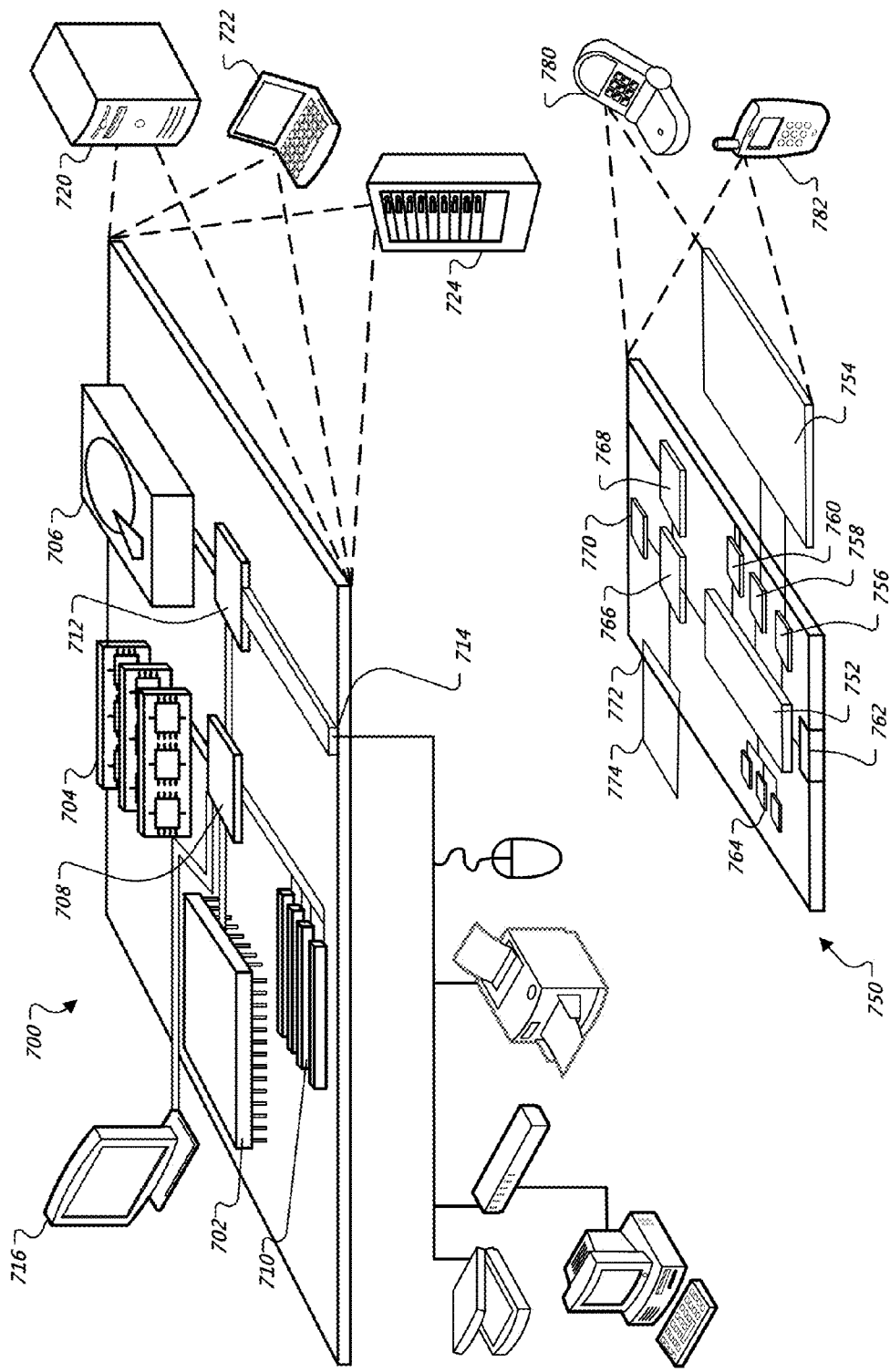
FIG. 7 is a block diagram of computing devices that may be used to implement the systems and methods described in this document, as either a client or as a server or plurality of servers.

FIG. 7 is a block diagram of computing devices 700, 750 that may be used to implement the systems and methods described in this document, as either a client or as a server or plurality of servers. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smartphones, and other similar computing devices. The components shown here, their connections and relationships, and their functions, are meant to be exemplary only, and are not meant to limit implementations described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high-speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, or memory on processor 702.

The high-speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. Additionally, the processor may be implemented using any of a number of architectures. For example, the processor 702 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT (Thin-Film-Transistor Liquid Crystal Display) display or an OLED (Organic Light Emitting Diode) display, or other appropriate display technology The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752 that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smartphone 782, personal digital assistant, or other similar mobile device.

Additionally computing device 700 or 750 can include Universal Serial Bus (USB) flash drives. The USB flash drives may store operating systems and other applications. The USB flash drives can include input/output components, such as a wireless transmitter or USB connector that may be inserted into a USB port of another computing device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for performing the systems and methods described in this document may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A computer-implemented method for encoding a document, the method comprising:

receiving an input document at a computing system that includes a plurality of data elements that identify semantics of respective data values in the input document, wherein the respective data values correspond to respective textual content in the input document;

determining, by the computing system, whether a name of a first data element in the input document is listed in a table of data element names;

generating, based on the input document, an output document that includes, as a result of determining that the name of the first data element is listed in the table of data element names, a reference from the table of data element names that corresponds to the name of the first data element, wherein the reference identifies the first data element with less characters than the name of the first data element;

determining, by the computing system, whether a first data value that corresponds to textual content of the first data element in the input document is listed in a table of textual content;

inserting, by the computing system, the first data value into the output document as a result of determining that the first data value is not listed in the table of textual content;

updating, by the computing system, the table of textual content to include the first data value as a result of determining that the first data value is not listed in the table of textual content;

determining, by the computing system, whether a name of a second data element in the input document is listed in the table of data element names;

inserting, by the computing system, the name of the second data element into the output document, as a result of determining that the name of the second data element is not listed in the table of data element names;

determining, by the computing system, whether a second data value that corresponds to textual content of the second data element in the input document is listed in the updated table of textual content, wherein the textual content of the second data element matches the textual content of the first data element;

inserting, by the computing system, into the output document, as a result of determining that the second data value is listed in the updated table of textual content, a reference to the first data value from the updated table of textual content; and storing, by the computing system, the output document having (i) the reference to the name of the first data element from the table of data element names, (ii) the first data value, (iii) the name of the second data element, and (iv) the reference to the first data value from the updated table of textual content.

2. The method of claim 1, wherein the first data element identifies semantics of the first data value.

3. The method of claim 2, wherein the second data element identifies semantics of the second data value.

4. The method of claim 1, further comprising determining, as a result of determining that the name of the second data element is not listed in the table of data element names, whether a namespace in the name of the second data element is listed in a table of namespace names associated with the computing system, wherein inserting into the output document the name of the second data element is performed as a result of determining that the namespace in the name of the second data element is not listed in the table of namespace names.

5. A computer-implemented method, comprising:

receiving an input document that includes multiple portions of text;

determining, by a computing system, whether a first portion of text in the input document is listed in a table of textual content associated with the computing system;

generating an output document that includes the first portion of text as a result of determining that the first portion of text is not listed in the table of textual content;

updating, by the computing system, the table of textual content to include the first portion of text as a result of determining that the first portion of text is not listed in the table of textual content;

determining, by the computing system, whether the updated table of textual content includes a second portion of text in the input document, wherein the second portion of text matches the first portion of text;

inserting, by the computing system and into the output document, as a result of determining that the second portion of text is listed in the table of textual content as a match to the first portion of text, a reference to the first portion of text from the updated table of textual content, wherein the reference to the first portion includes less characters than the first portion of text; and storing, by the computing system, the output document, having (i) the first portion of text, and (ii) the reference to the first portion of text from the updated table of textual content.

6. The method of claim 5, wherein the input document includes data values and corresponding data elements that identify semantics of the respective data values.

7. The method of claim 6, further comprising:

determining whether a name of a first data element in the input document is listed in a predefined table of data element names; and inserting into the output document, as a result of determining that the name of the first data element is listed in the predefined table of data element names, a reference to the name of the first data element from the table of data element names.

8. The method of claim 7, wherein the output document does not include the name of the first data element.

9. The method of claim 7, wherein the first data element in the input document includes an opening data element tag and a closing data element tag; and wherein the output document does not include the closing data element tag for the first data element.

10. The method of claim 7, further comprising:

determining whether a name of a second data element in the input document is listed in the predefined table of data element names; and inserting into the output document the name of the second data element as a result of determining that the names of the second data element is not listed in the predefined table of data elements names.

11. The method of claim 10, wherein the first and second data elements are XML data elements, and wherein the names of the first and second data elements are XML QNames.

12. The method of claim 5, wherein the output document is smaller in stored size than the input document.

13. The method of claim 12, wherein the input document is able to be losslessly reconstructed from the output document.

14. The method of claim 5, wherein the output document includes no more than a single instance of the first portion of text.

15. The method of claim 5, wherein the output document stores the first portion of text in binary representation.

16. A computer-implemented system, comprising:

a table of textual content, stored on one or more computer-readable devices, that includes multiple portions of text and identifies references to the multiple portions of text;

a text type identifier, executed by at least one programmable processor, to identify whether at least a first portion of text and a second portion of text in an input document is included in the table of textual content, wherein the first portion of text matches the second portion of text;

an encoder, executed by at least one programmable processor, to (i) include the first portion of text in an output document and update the table of textual content to include the first portion of text as a result of determining that the first portion of text is not included in the table of textual content, (ii) include in the output document a reference to the first portion of text from the table of textual content as a result of determining that the first portion of text is included in the table of textual content, wherein the reference to the first portion of text includes less characters than the first portion of text in the input document, and (iii) include the reference to the first portion of text from the updated table of textual content in the output document as a result of determining that the second portion of text matches the first portion of text.

17. The system of claim 16, further comprising:
a data element name table, stored on one or more computer-readable devices, that includes multiple names of data elements and identifies references to the multiple names, wherein the references comprise less characters than the multiple names; and
a data element name type identifier, executed by at least one programmable processor, to identify whether a name of a data element from the input document is included in the data element name table,
wherein the encoder is further adapted to (iii) include the name of the data element in the output document as a result of determining that the name of the data element is not included in the data element name table, and (iv) include in the output document a reference to the name of the data element from the data element name table as a result of determining that the name of the data element is included in the data element name table.

18. The system of claim 17, wherein the data element includes an XML data element and wherein the name of the data element includes an XML QName.

19. The system of claim 18, wherein the portion of text includes a data element value, the XML data element identifying semantics of the data element value.

20. The system of claim 16, further comprising:
a namespace table, stored on one or more computer-readable devices, that includes multiple namespaces of data elements and identifies corresponding references to the multiple namespaces; and
a namespace identifier, executed by at least one programmable processor, to identify whether a namespace of the data element is included in the namespace table,
wherein the encoder is further adapted to (iii) include the namespace of the data element and a name of the data element in the output document as a result of determining that the namespace of the data element is not included in the namespace table, and (iv) include the name of the data element and a reference to the namespace of the data element from the namespace table in the output document as a result of determining that the namespace of the data element is included in the namespace table.

* * * * *